United States Patent
Chandhok et al.

(10) Patent No.: US 11,152,254 B2
(45) Date of Patent: Oct. 19, 2021

(54) PITCH QUARTERED THREE-DIMENSIONAL AIR GAPS

(71) Applicant: INTEL CORPORATION, Santa Clara, CA (US)

(72) Inventors: Manish Chandhok, Beaverton, OR (US); Sudipto Naskar, Portland, OR (US); Stephanie A. Bojarski, Sherwood, OR (US); Kevin Lin, Beaverton, OR (US); Marie Krysak, Portland, OR (US); Tristan A. Tronic, Aloha, OR (US); Hui Jae Yoo, Hilsboro, OR (US); Jeffery D. Bielefeld, Forest Grove, OR (US); Jessica M. Torres, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/463,816

(22) PCT Filed: Dec. 28, 2016

(86) PCT No.: PCT/US2016/068976
§ 371 (c)(1),
(2) Date: May 23, 2019

(87) PCT Pub. No.: WO2018/125098
PCT Pub. Date: Jul. 5, 2018

(65) Prior Publication Data
US 2019/0385897 A1     Dec. 19, 2019

(51) Int. Cl.
*H01L 21/768* (2006.01)
*H01L 23/532* (2006.01)
*H01L 23/528* (2006.01)

(52) U.S. Cl.
CPC .... *H01L 21/7682* (2013.01); *H01L 21/76816* (2013.01); *H01L 23/528* (2013.01);
(Continued)

(58) Field of Classification Search
CPC .......... H01L 21/7682; H01L 21/76816; H01L 21/76889; H01L 23/528; H01L 23/53295
See application file for complete search history.

(56) References Cited

U.S. PATENT DOCUMENTS 9,072,187 B2 * 6/2015 Hu ........................... H05K 3/10
10,396,055 B2 * 8/2019 She ......................... H01L 24/49
(Continued)

FOREIGN PATENT DOCUMENTS

WO     2016-105344 A1     6/2016

OTHER PUBLICATIONS

International Search Report and Written Opinion dated Aug. 30, 2017, on application No. PCT/US2016/068976.

*Primary Examiner* — Mohsen Ahmadi
(74) *Attorney, Agent, or Firm* — Schwabe, Williamson & Wyatt, P.C.

(57) ABSTRACT

An integrated circuit die, a semiconductor structure, and a method of fabricating the semiconductor structure are disclosed. The integrated circuit die includes a substrate and a first anchor and a second anchor disposed on the substrate in a first plane. The integrated circuit die also includes a first wire disposed on the first anchor in the first plane, a third wire disposed on the second anchor in the first plane, and a second wire and a fourth wire suspended above the substrate in the first plane. The second wire is disposed between the first wire and the third wire and the third wire is disposed between the second wire and the fourth wire. The integrated circuit die further includes a dielectric material disposed
(Continued)

between upper portions of the first wire, the second wire, the third wire, and the fourth wire to encapsulate an air gap.

9 Claims, 8 Drawing Sheets

(52) U.S. Cl.
CPC .. *H01L 23/53295* (2013.01); *H01L 21/76889* (2013.01); *H01L 2221/1047* (2013.01)

(56) References Cited

U.S. PATENT DOCUMENTS

| | | | |
|---|---|---|---|
| 2006/0264027 A1* | 11/2006 | Su | H01L 23/53295 |
| | | | 438/619 |
| 2011/0108992 A1 | 5/2011 | Chanda et al. | |
| 2012/0038037 A1* | 2/2012 | Chen | H01L 23/5222 |
| | | | 257/734 |
| 2012/0326269 A1* | 12/2012 | Bonilla | H01L 21/768 |
| | | | 257/529 |
| 2013/0026451 A1* | 1/2013 | Bangsaruntip | H01L 29/66772 |
| | | | 257/24 |
| 2013/0292835 A1* | 11/2013 | King | H01L 21/7682 |
| | | | 257/741 |
| 2015/0179578 A1* | 6/2015 | Jezewski | H01L 21/31144 |
| | | | 257/768 |
| 2015/0214094 A1 | 7/2015 | Jezewski et al. | |
| 2016/0049487 A1* | 2/2016 | Xu | H01L 29/41791 |
| | | | 257/288 |
| 2016/0093566 A1 | 3/2016 | Ting et al. | |
| 2017/0140979 A1* | 5/2017 | Lin | H01L 23/5222 |
| 2017/0330832 A1* | 11/2017 | He | H01L 21/7682 |
| 2018/0145035 A1* | 5/2018 | Singh | H01L 23/49827 |

\* cited by examiner

PITCH QUARTERED THREE-DIMENSIONAL AIR GAPS

BACKGROUND

This patent application is a U.S. National Phase Application under 35 U.S.C. § 371 of International Application No. PCT/US2016/068976, filed on Dec. 28, 2016, the entire contents of which is hereby incorporated by reference herein.

Circuits include metal lines (e.g., wires) that are closely spaced and arranged in layers. Isolation of metal lines in the same layer and isolation of metal lines between layers can be provided by interlevel dielectrics (IDLs). IDLs may have a low dielectric constant (e.g., a "low-κ" or "low-k" dielectric) to minimize capacitive coupling (e.g., cross talk) between adjacent metal lines.

BRIEF DESCRIPTION OF THE DRAWINGS

The present disclosure described herein is illustrated by way of example and not by way of limitation in the accompanying figures. For simplicity and clarity of illustration, features illustrated in the figures are not necessarily drawn to scale. For example, the dimensions of some features may be exaggerated relative to other features for clarity. Further, where considered appropriate, reference labels have been repeated among the figures to indicate corresponding or analogous elements.

DETAILED DESCRIPTION

In the following description, various aspects of the illustrative implementations will be described using terms commonly employed by those skilled in the art to convey the substance of their work to others skilled in the art. However, it will be apparent to those skilled in the art that the present disclosure may be practiced with only some of the described aspects. For purposes of explanation, specific numbers, materials and configurations are set forth in order to provide a thorough understanding of the illustrative implementations. However, it will be apparent to one skilled in the art that the present disclosure may be practiced without the specific details. In other instances, well-known features are omitted or simplified in order not to obscure the illustrative implementations.

The solid-state electronics industry is continuously miniaturizing semiconductor and device dimensions, leading to smaller components and more components in each circuit. Miniaturization and increase in components has led to thinner interlayer dielectrics (IDLs). As IDLs become thinner, there is more capacitive coupling (e.g., cross talk) between metal lines on the same layer and metal lines on different layers. Circuits may be designed with air gaps between metal lines of the same layer to reduce line-to-line capacitance (e.g., cross talk between metal lines on the same layer). To reduce layer-to-layer capacitance (e.g., cross talk between metal lines on different layers), dielectric materials with a lower dielectric constant may be used to provide isolation between metal lines on different layers (e.g., lower dielectric constant in the via ILD). Materials with a lower dielectric constant also have a lower etch resistance. Therefore, via etches will undesirably increase the critical dimension (CD) of the via ILD that has a lower dielectric constant which may lead to a loss of CD control (e.g., CD blowout).

The present disclosure addresses the above-mentioned and other deficiencies by using three-dimensional air gaps (e.g., floating wires) to reduce layer-to-layer capacitance.

In one implementation, an integrated circuit die includes a substrate, a first anchor and a second anchor on the substrate in a first plane, a first wire on the first anchor in the first plane, a third wire on the second anchor in the first plane, a second wire and a fourth wire above the substrate in the first plane, wherein the second wire is between the first wire and the third wire and the third wire is between the second wire and the fourth wire, and a dielectric material between upper portions of the first wire, the second wire, the third wire, and the fourth wire to encapsulate an air gap. In some implementations, the first wire includes a metal capped with a first hard mask, the second wire comprises the metal capped with a second hard mask, the third wire comprises the metal capped with the first hard mask, the fourth wire comprises the metal capped with the second hard mask, and the dielectric material is between each instance of the first hard mask and each instance of the second hard mask. In some implementations, adjacent wires are not capped with a same hard mask material and the air gap is at least below and on sides of the third wire and the fourth wire. In some implementations, the first anchor and the second anchor comprise a tungsten oxide, a hafnium oxide, a zirconium oxide, silicon mononitride (SiN), silicon carbide (SiC), silicon carbonitride (SiCN), or a second dielectric comprising disilicon carbide (Si—C—Si), the metal comprises cobalt (Co), copper (Cu), ruthenium (Ru), cobalt monosilicide (CoSi), or nickel mono-silicide (NiSi), the first hard mask comprises SiC, silicon oxycarbide (SiOC), zirconium dioxide ($ZrO_2$), hafnium dioxide ($HfO_2$), or a tungsten oxide, the second hard mask comprises SiC, SiOC, $ZrO_2$, $HfO_2$, or W oxide, the second hard mask is a different material than the first hard mask; and the dielectric material is a metal oxide that is a different material than the first hard mask and the second hard mask.

In another implementation, a semiconductor structure includes a first wire and a second wire anchored to a substrate in a first plane, a third wire and a fourth wire above to the substrate in the first plane, wherein the second wire is between the first wire and the third wire and the third wire is between the second wire and the fourth wire, and a dielectric material between upper portions of the first wire, the second wire, the third wire, and the fourth wire to encapsulate an air gap. In some implementations, the first wire comprises a metal capped with a first hard mask, the second wire comprises the metal capped with a second hard mask, the third wire comprises the metal capped with the first hard mask, the fourth wire comprises the metal capped with the second hard mask, and the dielectric material is between each instance of the first hard mask and each instance of the second hard mask. In some implementations, adjacent wires are not capped with a same hard mask material and the air gap is at least below and on sides of the third wire and the fourth wire. In some implementations, the first anchor and the second anchor comprise a tungsten oxide, a hafnium oxide, a zirconium oxide, silicon mononitride (SiN), silicon carbide (SiC), silicon carbonitride (SiCN), or a second dielectric comprising disilicon carbide (Si—C—Si), the metal comprises cobalt (Co), copper (Cu), ruthenium (Ru), cobalt monosilicide (CoSi) or nickel monosilicide (NiSi), the first hard mask comprises SiC, silicon oxycarbide (SiOC), zirconium dioxide ($ZrO_2$), hafnium dioxide ($HfO_2$), or a tungsten oxide, the second hard mask comprises SiC, SiOC, $ZrO_2$, $HfO_2$, or W oxide, the second hard mask is a different material than the first hard mask, and the dielectric material is a metal oxide that is a different material than the first hard mask and the second hard mask.

In another implementation, a method of fabricating a semiconductor structure includes forming a first anchor and a second anchor on a substrate in a first plane, forming a first wire on the first anchor and a second wire on the second anchor in the first plane, forming a plurality of wires above the substrate in the first plane, and depositing a dielectric material between upper portions of each of the first wire, the second wire, and the plurality of wires to encapsulate an air gap.

In some implementations, the forming of the first anchor on the substrate includes forming a plurality of polysilicon lines on the substrate, depositing a spacer on the substrate and the plurality of polysilicon lines, and removing a first portion of the spacer to expose a first portion of the substrate between first and second polysilicon lines of the plurality of polysilicon lines, wherein the first anchor is formed on the first portion of the substrate. In some implementations, the forming of the first wire on the first anchor and forming a first portion of the plurality of wires comprises depositing a metal capped with a first hard mask between each of the plurality of polysilicon lines, wherein the first wire comprises a first instance of the metal capped with the first hard mask. In some implementations, the forming of the second anchor includes removing the plurality of polysilicon lines, depositing the spacer on the substrate, and removing a second portion of the spacer to expose a second portion of the substrate between a second instance of the metal capped with the first hard mask and a third instance of the metal capped with the first hard mask, wherein the second anchor is formed on the second portion of the substrate, wherein the first portion of the plurality of wires comprises the second instance of the metal capped with the first hard mask and the third instance of the metal capped with the first hard mask. In some implementations, the forming of the second wire on the second anchor and forming of a second portion of the plurality of wires comprises depositing the metal capped with a second hard mask between each instance of the metal capped with the first hard mask, wherein the second wire comprises a first instance of the metal capped with the second hard mask. In some implementations, the forming of the plurality of wires above the substrate further comprises removing the spacer, and the first anchor is between the second instance of the metal capped with the second hard mask and the third instance of the metal capped with the second hard mask. In some implementations, adjacent wires are not capped with a same hard mask material and the air gap is below and on sides of the plurality of wires.

In some implementations, the spacer comprises one or more of silicon dioxide ($SiO_2$), (titanium nitride (TiN), or a wet etchable material, and the removing of the first portion of the spacer includes depositing a carbon hard mask on the spacer, and lithographically cutting the carbon hard mask above the first portion of the substrate between the first and second polysilicon lines, wherein removing the first portion of the spacer comprises etching the first portion of the spacer from the first portion of the substrate. In some implementations, forming the first anchor further comprises spinning a first material or deposing a second material on the first portion of the substrate, wherein the first material comprises a tungsten oxide, a hafnium oxide, a zirconium oxide, or a second dielectric material comprising disilicon carbide (Si—C—Si), wherein the second material comprises silicon mononitride (SiN), silicon carbide (SiC), or silicon carbonitride (SiCN), the forming of the second anchor further includes polishing an upper portion of the spacer to expose an upper portion of each of the plurality of polysilicon lines, each of the plurality of polysilicon lines comprises a polysilicon patterned on SiN, SiC, or alumina ($Al_2O_3$) and capped with a SiN hard mask, and spinning the first material or deposing the second material on the second portion of the substrate.

In some implementations, the forming of the first wire on the first anchor includes removing the carbon hard mask, deposing first instances of a metal between each of the plurality of polysilicon lines, wherein the metal comprises cobalt (Co), copper (Cu), ruthenium (Ru), or amorphous silicon (a-Si), wherein nickel (Ni) is to be deposited on the aSi and annealed to form nickel mono-silicide (NiSi), recessing the first instances of the metal, and depositing a first hard mask on each of the first instances of the metal to form first instances of the metal capped with the first hard mask, the first hard mask comprising SiC, silicon oxycarbide (SiOC), zirconium dioxide ($ZrO_2$), hafnium dioxide ($HfO_2$), or a tungsten oxide. In some implementations, the forming of the second wire on the second anchor further includes deposing second instances of the metal between each of the first instances of the metal capped with the first hard mask, recessing the second instances of the metal, and depositing a second hard mask on each of the second instances of the metal, the second hard mask comprising SiC, silicon oxycarbide (SiOC), zirconium dioxide ($ZrO_2$), hafnium dioxide ($HfO_2$), or a tungsten oxide, wherein the second hard mask is a different material than the first hard mask. In some implementations, the dielectric material is a metal oxide that is a different material than the first hard mask and the second hard mask, and the deposing of the dielectric material to encapsulate the air gap comprises filing the air gap with a vacuum or an inert gas, the inert gas comprising one or more of nitrogen, helium, argon, air, or a gas with a capacitance similar to capacitance of air.

Figure 1A:
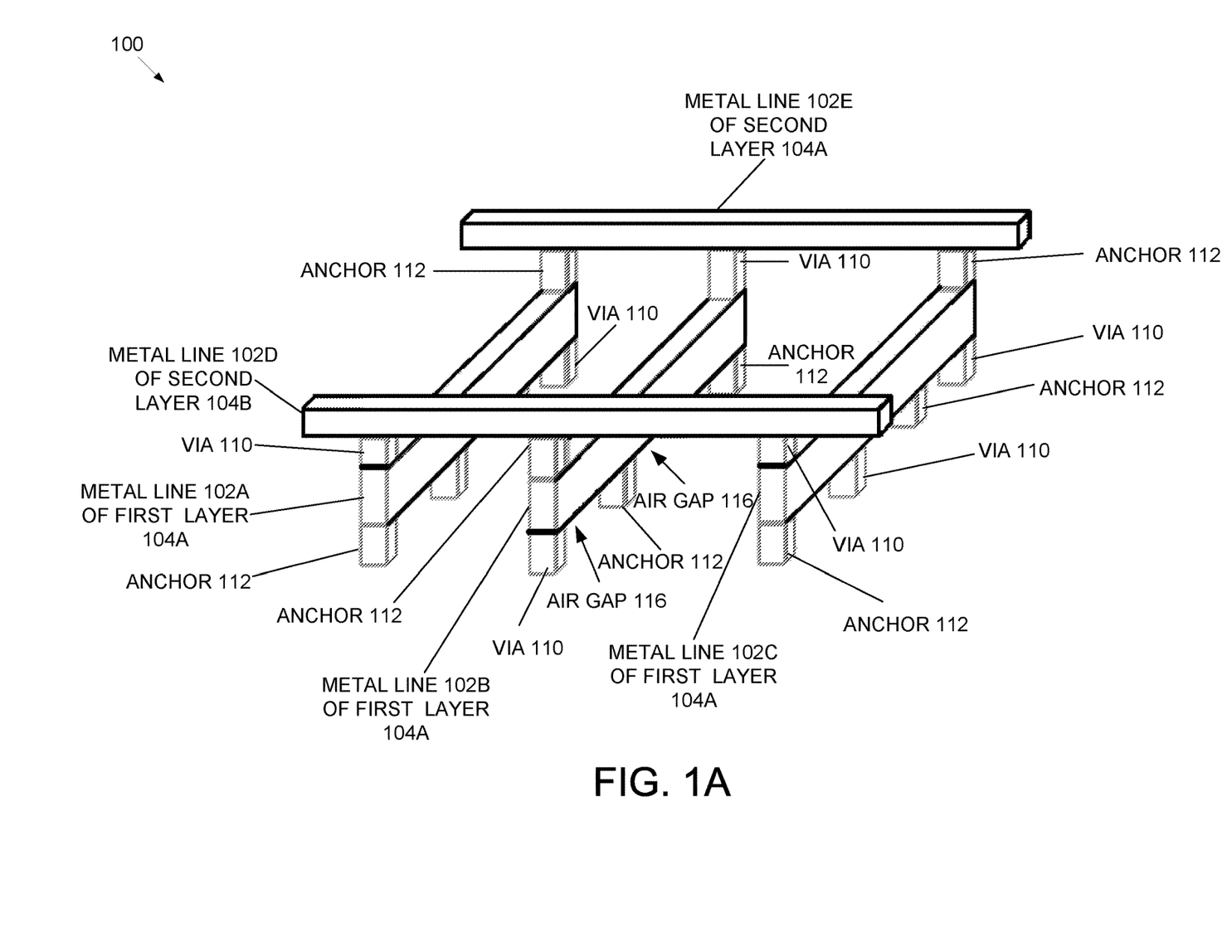
FIG. 1A illustrates a three-dimensional (3D) air gap interconnect, according to an implementation.

FIG. 1A illustrates a three-dimensional (3D) air gap interconnect, according to an implementation. A semiconductor structure may include an interconnect structure 100. The interconnect structure 100 may include metal lines 102A, 102B, and 102C on a first layer 104A and metal lines 102D and 102E on a second layer 104B. Interconnect structure 100 may include one or more vias 110, one or more anchors 112, and one or more air gaps 114.

A metal line 102 may be one or more of an electrically conductive material, a wire, a metal wire, etc. Reduction of circuit component sizes and increasing density of circuit components creates interconnects 100 with metal lines 102 that are more proximate. A metal line 102 may transmit a signal. A first signal present on a metal line 102 may interfere with a second signal on an adjacent metal line 102 (e.g., cross-talk, electromagnetic interference, cause delay errors, reduce frequency bandwidth, capacitive coupling, etc.). As device sizes continue to shrink, the dielectric constant of the material between the metal lines 102 must decrease to maintain the same functionality.

Two or more layers 104 of metal lines 102 may be used in a semiconductor structure to provide more functionality and/or require a small surface area as compared to a non-stacked metal line 102 layout. The metal lines 102 on different layers 104 may be coupled by vias 110.

A via 110 may provide an electrical connection between layers 104. An insulating layer (e.g., insulator oxide layer, spacer, dielectric material, air gap, etc.) may be formed between separate layers 104 of metal lines 102. A via 110 may include an opening in an insulating layer that allows a conductive connection between different layers 104. A via 110 may include one or more of a barrel (e.g., a conductive tube filling a drilled hole), a pad (e.g., connects each end of the barrel to a component, plane, trace, metal line 102, or layer 104), or an antipad (e.g., a clearance hole between barrel and a metal layer 102 to which the via 110 is not connected). A via 110 on an integrated circuit may be referred to as a through-chip via and a via 110 that connects the lowest layer 104 of metal lines 102 to diffusion or poly may be referred to as a contact.

An anchor 112 may connect a metal line 102 on a first layer 104 to another metal line 102 on a second layer 104. An anchor 112 may connect a metal line on a first layer 104 to a substrate. Anchor 112 may be one or more of a metallic oxide (tungsten oxide, hafnium oxide, zirconium oxide, etc.), a dielectric (e.g., with a disilicon carbide (Si—C—Si) backbone, properly cured to withstand hydrofluoric acid), or a non-conformal silicon mononitride (SiN) or silicon carbide (SiC) or silicon carbonitride (SiCN).

An air gap 114 may be created between metal lines 102 or between a metal line 102 and the substrate. An air gap 114 may be filled with a vacuum or an inert gas (e.g., one or more of nitrogen, helium, argon, air, a gas with a capacitance similar to capacitance of air, etc.).

Figure 1B:
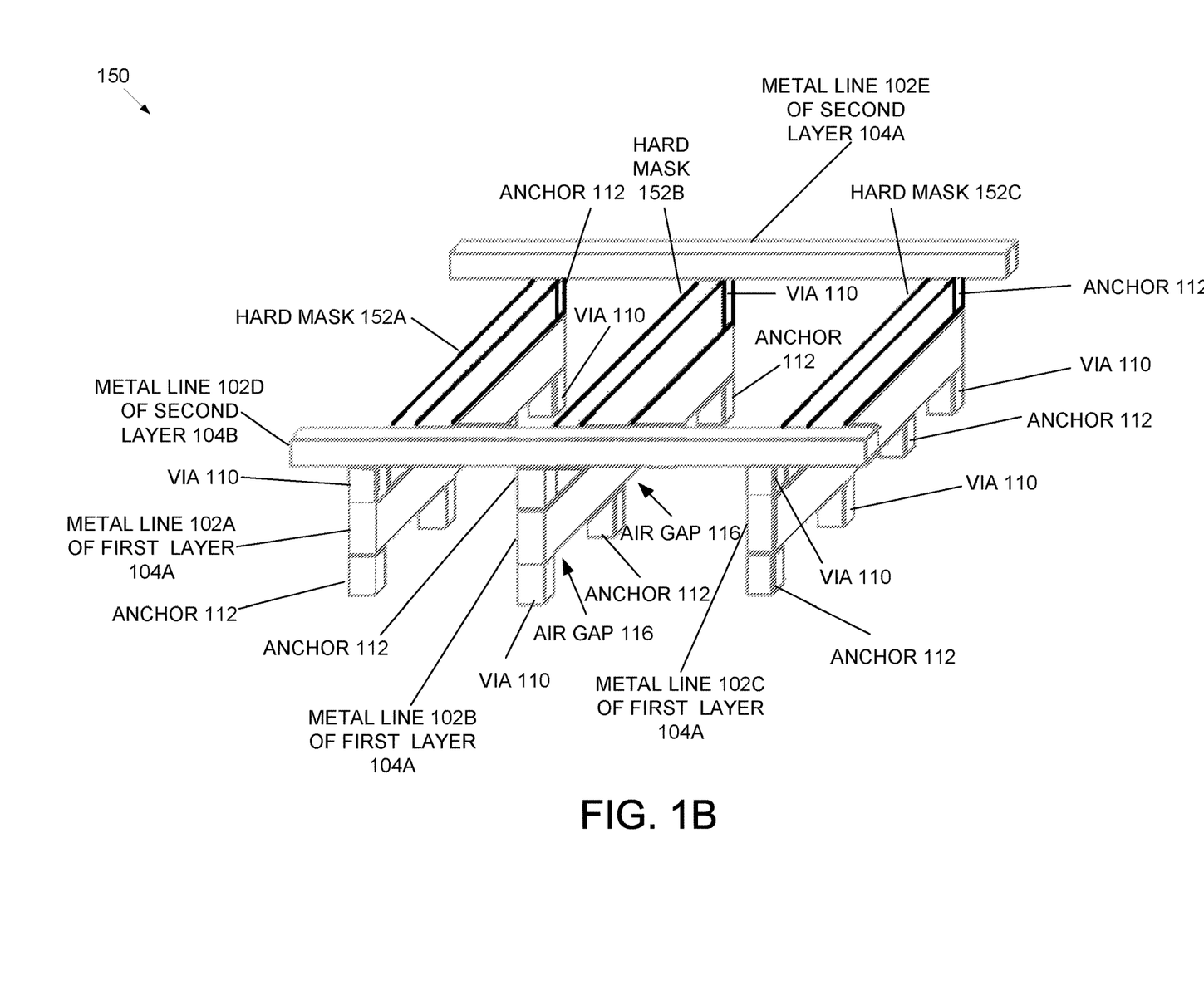
FIG. 1B illustrates a 3D air gap interconnect with hard masks, according to an implementation.

FIG. 1B illustrates a three-dimensional (3D) air gap interconnect with hard masks, according to an implementation. The components of FIG. 1B may be the same as the corresponding components of FIG. 1A with the same reference number. The interconnect structure 150 may include a metal lines 102A, 102B, and 102C on a first layer 104A. Metal line 120A may include a metal capped with a hard mask 152A of a first material, metal line 120B may include the metal capped with a hard mask 152B of a second material, and metal line 120C may include the metal capped with a hard mask 152C of the first material. Adjacent metal lines 102 may not include a metal capped with a hard mask 152 of the same material.

Figure 2A:
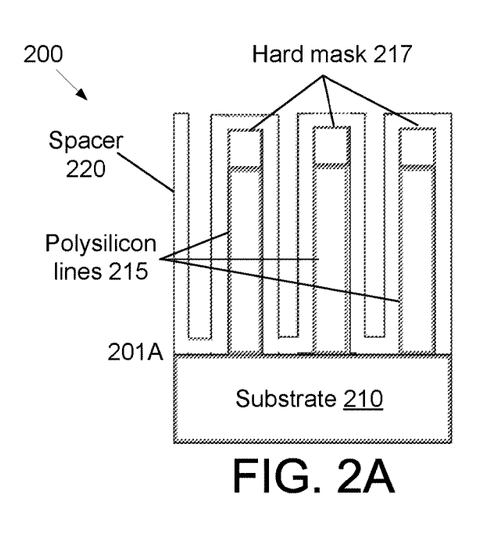
FIGS. 2A-2Q illustrate a fabrication process for a semiconductor structure with 3D air gaps, according to an implementation.
Figure 2B:
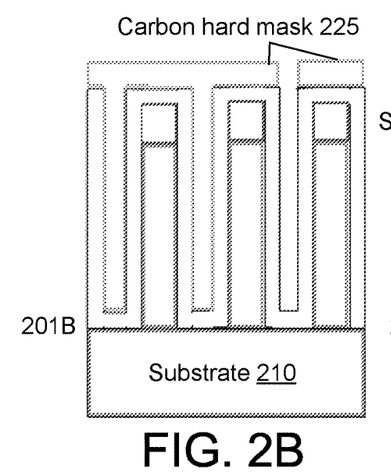
Figure 2C:
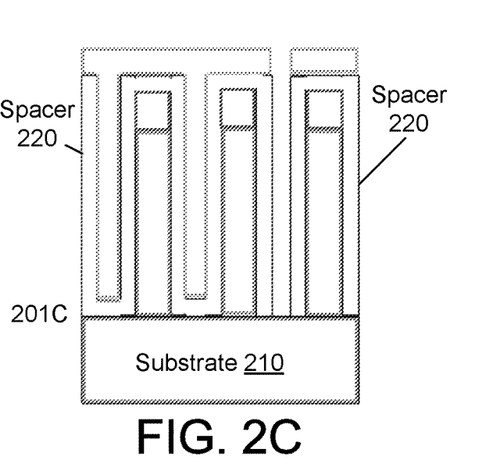
Figure 2D:
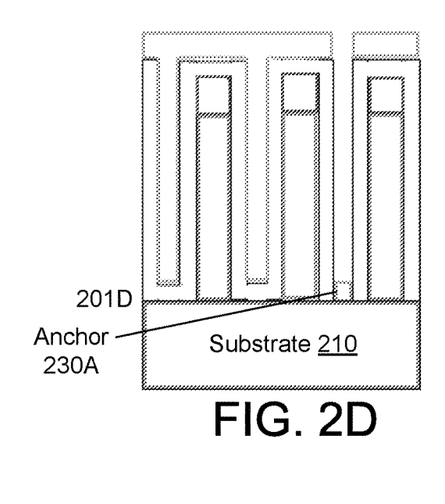
Figure 2E:
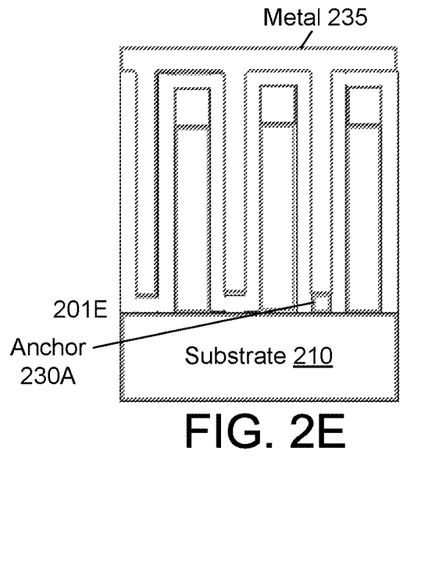
Figure 2F:
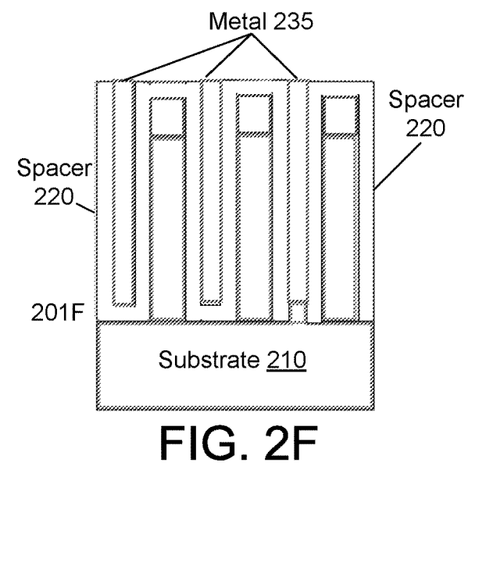
Figure 2G:
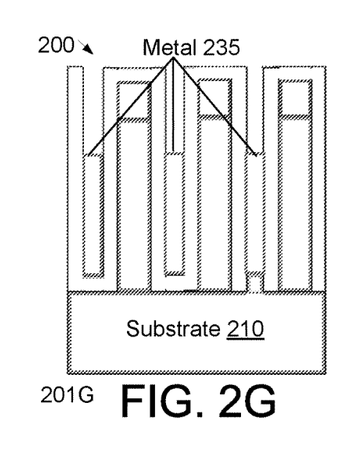
Figure 2H:
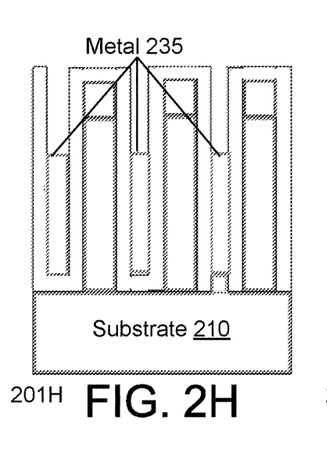
Figure 2I:
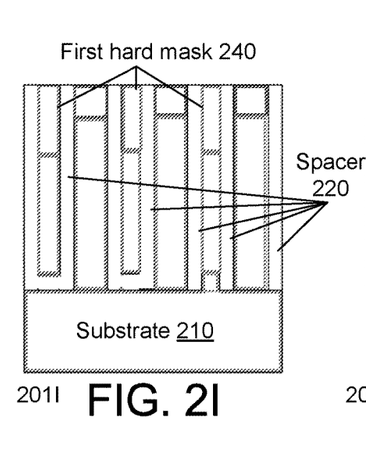
Figure 2J:
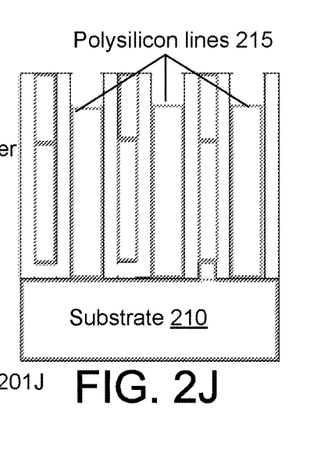
Figure 2K:
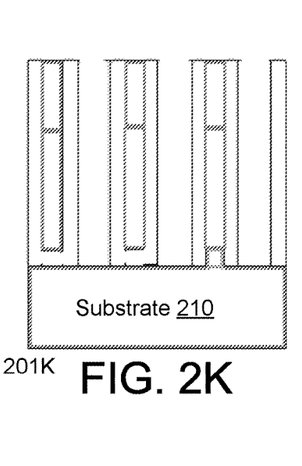
Figure 2L:
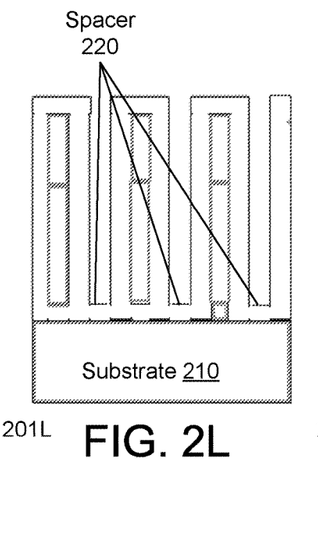
Figures 2M, 2N:
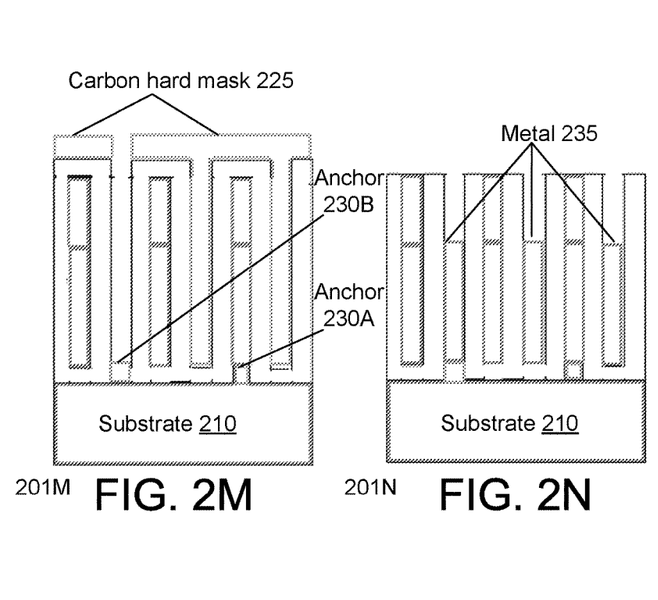
Figure 2O:
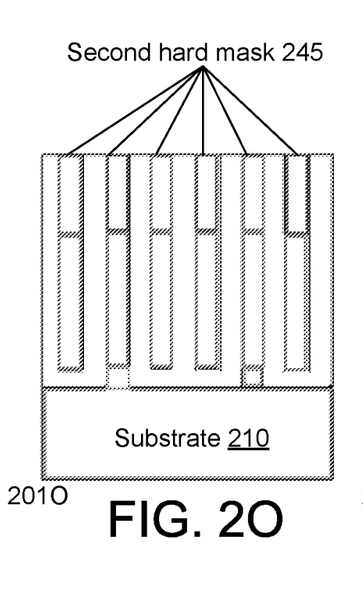
Figure 2P:
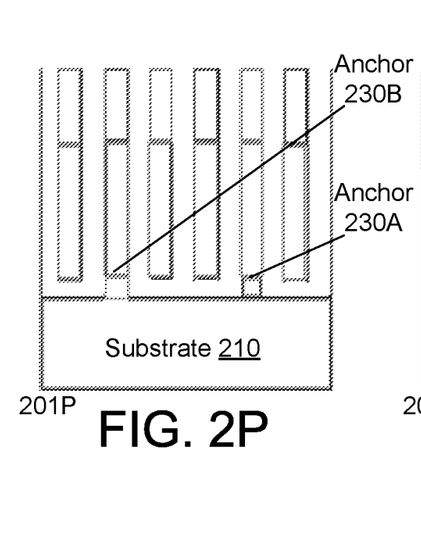
Figure 2Q:
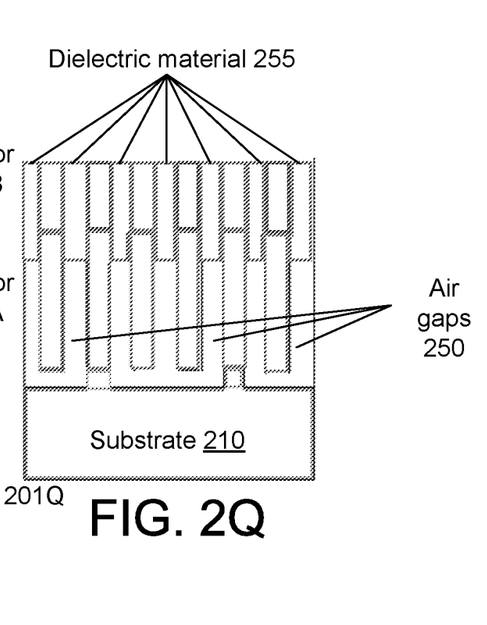

FIGS. 2A-2Q illustrate a fabrication process for a semiconductor structure with 3D air gaps, according to an implementation. Fabrication process 200 includes semiconductor structure 201 at various stages of the fabrication process 200, according to one exemplary implementation. It may be noted that fabrication process 200 is shown for purposes of illustration, rather than limitation. Fabrication process 200 may be performed in any order, include any number of processes, and include more, the same, or fewer processes. It may also be noted that for purposes of illustration, rather than limitation, materials are illustrated in the various layers of fabrication process 200. Other materials, other or in addition to the materials illustrated in FIGS. 2A-2Q, may also be used in other implementations. FIGS. 2A-2Q show the formation of 3D air gaps above the substrate 210 of the semiconductor structure 201. It may be noted that multiple 3D air gaps may be formed on the same layer of structure 201 and on different layers of structure 201. It may be noted that the formation of a semiconductor structure with 3D air gaps is described for purposes of illustration, rather than limitation. It may also be noted that processes herein, such as fabrication process 200 and process flow 300 of FIG. 3, may be extended to produce a first one or more 3D air gaps. For example, processes for creating second one or more 3D air gaps (e.g., on the same layer, on a different layer) may be removed from fabrication process 200, in some implementations.

FIG. 2A illustrates a cross section in a first plane of structure 201A. Structure 201A illustrates a substrate 210. Substrate 210 may be a variety of materials, including, but not limited to, Sapphire, Silicon, Gallium Nitride (GaN), Germanium, or Silicon Carbide. Substrate 210 may be silicon on insulator (SOI). In one implementation, substrate 210 is silicon. Crystallographic orientation of a substantially monocrystalline substrate 210 may be any of (100), (111), or (110) on the Miller Indices. Other crystallographic orientations are also possible. The crystallographic orientations of substrate 210 may be offcut. In one implementation, substrate 210 is (100) silicon with crystalline substrate surface region having cubic crystallinity. In another implementation, for a (100) silicon substrate 210, the semiconductor surface may be miscut, or offcut, for example 2-10° toward [110]. In another implementation, substrate 210 is (111) silicon with crystalline substrate surface region having hexagonal crystallinity.

It may be noted that a buffer layer (not shown) may be disposed between the polysilicon lines 215 and substrate 210. An appropriate buffer layer may be disposed corresponding to the material type of substrate 210.

Polysilicon lines 215 may be disposed or grown over substrate 210. The polysilicon lines 215 may include a polysilicon patterned at twice the final pitch (e.g., pitch is the width of a metal line plus the spacing between two metal lines) and capped with a hard mask 217. The hard mask 217 may be SiN. The polysilicon lines 215 may be patterned on SiN, SiC, or alumina. A spacer 220 (e.g., SiO$_2$ oxide) may be deposed on the polysilicon lines 215.

FIG. 2B illustrates a cross section in the first plane of structure 201B. Structure 201B illustrates depositing a carbon hard mask (CHM) 225 on the spacer 220 and lithographically patterning one or more cuts in the CHM 225 to form a mask opening (see FIGS. 4A-C).

FIG. 2C illustrates a cross section in the first plane of structure 201C. Structure 201C illustrates transferring, by etch, the cut pattern into the spacer 220 (e.g., at the mask opening 400 (see FIGS. 4A-C).

FIG. 2D illustrates a cross section in the first plane of structure 201D. Structure 201D illustrates depositing the anchor 230A. Anchors 230A may be the same as one or more of the anchors 112 from FIGS. 1A-B. In one implementation, the anchor 230A may be deposed using a spin-on technique. The material of the anchor 230A can be a spin-on metallic oxide (tungsten oxide, hafnium oxide, or zirconium oxide) that is deposited only up to a threshold height. The anchor 230A may be a spin-on dielectric that has Si—C—Si (e.g., not Si—O—Si) in the backbone and that is properly cured to withstand hydrofluoric (HF) acid. In another implementation, a non-conformal SiN, SiC, or SiCN may be used (e.g., instead of a spin-on) which may leave a thin etch top layer on the oxide spacer and may help protect the metal barrier from the HF strip during air gap 250 formation.

FIG. 2E illustrates a cross section in the first plane of structure 201E. Structure 201E illustrates removing the CHM 225 (e.g., the CHM 225 is ashed away) and filling the regions between the spacers 220 with a metal 235. The metal 235 may be a recessable material such as cobalt (Co), copper (Cu), ruthenium (Ru), or amorphous silicon (a-Si) (e.g., a-Si which is silicided later to form CoSi or NiSi).

FIG. 2F illustrates a cross section in the first plane of structure 201F. Structure 201F illustrates polishing metal overburden of the metal 235.

FIG. 2G illustrates a cross section in the first plane of structure 201G. Structure 201G illustrates recessing the metal 235. The metal 235 may be the same as one or more of the metal lines 102 from FIGS. 1A-1B.

FIG. 2H illustrates a cross section in the first plane of structure 201H. Structure 201H illustrates an implementation when metal 235 is a-Si. After recessing the a-Si, Ni may be deposited and annealed to form NiSi (e.g., silicided to form NiSi) or Co may be deposited and annealed to form CoSi (e.g., silicided to form CoSi).

FIG. 2I illustrates a cross section in the first plane of structure 201I. Structure 201I illustrates depositing a first hard mask 240 (a first "color" hard mask) on the metal 235 and polishing the first hard mask 240. First hard mask 240 may include SiC, SiOC, ZrO2, HfO2, or W oxide. The first hard mask 240 may be one or more of a dielectric, a carbide, or a metallic carbide. First hard mask 240 may be the same as hard masks 152A and 152C from FIG. 1B. Metal 235 capped with the first hard mask 240 may be referred to as a metal line or a wire.

FIG. 2J illustrates a cross section in the first plane of structure 201J. Structure 201J illustrates removing the hard mask 217 to expose the polysilicon lines 215.

FIG. 2K illustrates a cross section in the first plane of structure 201K. Structure 201K illustrates removing (e.g., etching out) the polysilicon lines 215 to expose portions of the substrate 210.

FIG. 2L illustrates a cross section in the first plane of structure 201L. Structure 201L illustrates deposing spacer 220 on at least the exposed portions of the substrate 210. Spacer 220 may also be deposed on the first hard masks 240. Spacer 220 may also be deposed on the spacer 220 (e.g., vertical walls of spacer 220, exposed portions of spacer 220).

FIG. 2M illustrates a cross section in the first plane of structure 201M. Structure 201M illustrates deposing a carbon hard mask (CHM) 225 on the spacer 220, lithographically patterning cuts in the CHM 225, transferring, by etch, the cut pattern into the spacer 220 to expose a second portion of the substrate 210, and deposing an anchor 230B on the second portion of the substrate. Anchors 230A and 230B (hereinafter anchor 230) may be the same as one or more of the anchors 112 from FIGS. 1A-1B.

FIG. 2N illustrates a cross section in the first plane of structure 201N. Structure 201N illustrates removing the CHM 225, filling the regions between the spacers 220 (e.g., where the CHM 225 was previously deposed) with the metal 235, polishing metal overburden of the metal 235, recessing the metal 235, and Ni or Co may be deposited on the metal 235 and annealed if metal 235 is an aSi. The metal 235 may be the same as one or more of the metal lines 102 from FIGS. 1A-1B.

FIG. 2O illustrates a cross section in the first plane of structure 201O. Structure 201O illustrates a second hard mask 245 (a second "color" hard mask) is deposited on the metal 235 and the second hard mask 245 is polished. The second mask 245 may include SiC, SiOC, ZrO2, HfO2, or W oxide. The second mask 245 may be one or more of a dielectric, a carbide, or a metallic carbide. The second mask 245 is different from the first hard mask 240. Second mask 245 may be the same as hard mask 152B from FIG. 1B. Metal 235 capped with the second hard mask 245 may also be referred to as a metal line or a wire.

At structure 201O, the pitch quartering (PQ) interconnect with "coloring" may be complete. Pitch quartering (e.g., reducing pitch size of a starting pattern by a factor of four) may be a process that uses two consecutive indirect patterning processes. A process is performed to define a backbone trench profile (e.g., polysilicon lines 215). A conformal spacer (e.g., spacer 220) is then deposited on the backbone trench profile. The spacer creates additional trenches between the existing number of trenches (see FIG. 2N), effectively doubling the number of trenches. Pitch quartering may turn one trench into four smaller size trenches.

FIG. 2P illustrates a cross section in the first plane of structure 201P. Structure 201P illustrates removing spacer 220 to form air gaps 250. Air gaps 250 may be the same as one or more of the air gaps 116 in FIGS. 1A-1B. A hydrofluoric (HF) cleanse may be ran to remove spacer 220 throughout the structure 201P. The material of anchors 230 is not etched. A first set of the metal 235 (e.g., metal lines, wires) are disposed on the anchors 230 and a second set of the metal 235 (e.g., metal lines, wires) are suspended above the substrate 210 between the anchors 230.

FIG. 2Q illustrates a cross section in the first plane of structure 201Q. Structure 201Q illustrates deposing a dielectric material 255 (e.g., non-conformal dielectric) to encapsulate the air gap 250. The dielectric material 255 may be deposed between upper portions of the metal lines (e.g., wires, metal 235 capped with a hard mask). The dielectric material 255 may be deposed between the first hard masks 240 and the second hard masks 245. The dielectric material 255 is a material that does not etch in during etching of first hard mask 240 and second hard mask 245 etches (e.g., next layer via patterning) so that the unlanded vias 110 do not punch through the air gap 255. The dielectric material 255 may be a metal oxide that is not the same as the material of first hard mask 240 and second hard mask 245. The air gaps 250 may be a vacuum (e.g., pump out the gas in the air gaps 250). The air gaps may include an inert gas (e.g., nitrogen, helium, argon, air, etc.).

Figure 3:
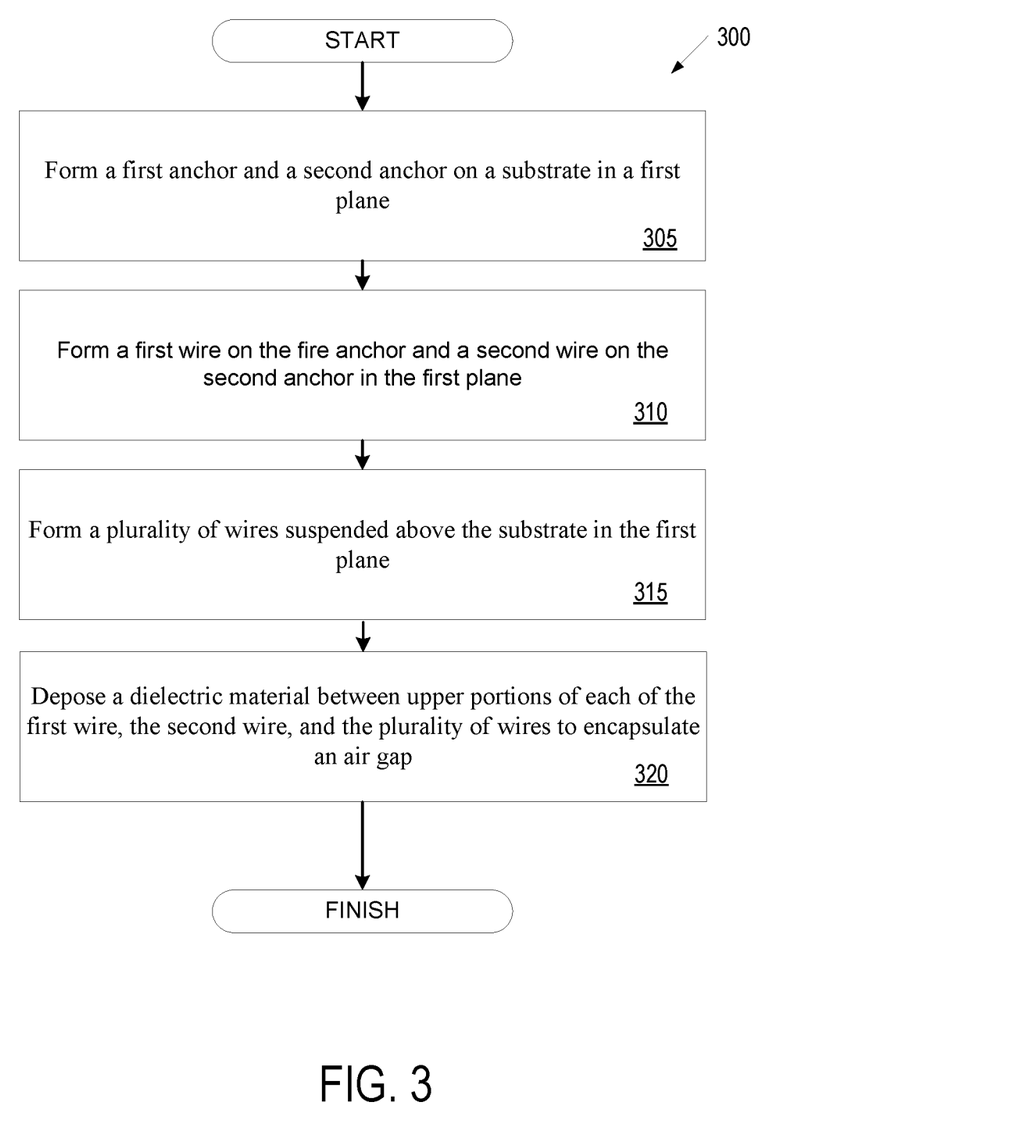
FIG. 3 illustrates a process flow for fabricating a semiconductor structure with 3D air gaps, according to another implementation.

FIG. 3 illustrates a process flow for fabricating a semiconductor structure with 3D air gaps, according to one implementation. It may be noted that features of FIGS. 2A-2Q may be described below to help illustrate method 300. Method 300 may be performed as operations. It may be noted that method 300 may be performed in any order and may include the same, more, or fewer operations. It may be noted that method 300 may be performed by one or more pieces of semiconductor fabrication equipment or fabrication tools.

Method 300 begins at operation 305 that forms a first anchor 230A and a second anchor 230B on a substrate 210 in a first plane (e.g., the plane displayed in FIGS. 2A-2Q). Operation 305 may be further described with respect to structures 201A-201M of FIGS. 2A-2M.

At operation 310, a first wire (e.g., metal 235 capped with first hard mask 240 (see FIG. 2I)) is formed on the first anchor 230A and a second wire (e.g., metal 235 capped with second hard mask 245 (see FIG. 2O)) is formed on the second anchor 230B in the first plane. Operation 310 may be further described with respect to structures 201E-201I of FIGS. 2E-2I and structures 201N-201O of FIGS. 2N-2O.

At operation 315, wires (e.g., metal 235 capped with first hard mask 240 and metal 235 capped with second hard mask 245) are suspended above the substrate 210 in the first plane. Operation 315 may be further described with respect to structure 201P of FIG. 2P.

At operation 320, a dielectric material 255 is deposed between upper portions of each of the first wire, the second wire, and the wires that are suspended to encapsulate an air gap 250. Operation 320 may be further described with respect to structure 201Q of FIG. 2Q.

Additional details of method 300 may be described at least with respect to FIG. 2A-2Q.

Figure 4A:
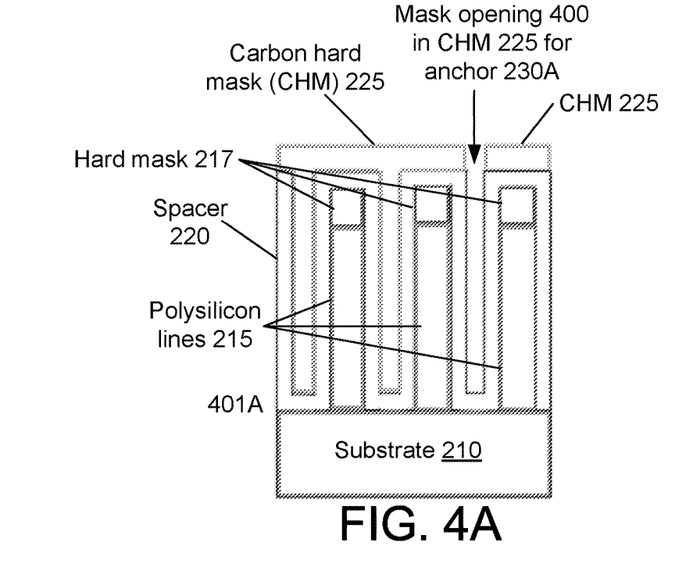
FIGS. 4A-C illustrate anchor locations in a semiconductor structure, according to one implementation.
Figure 4B:
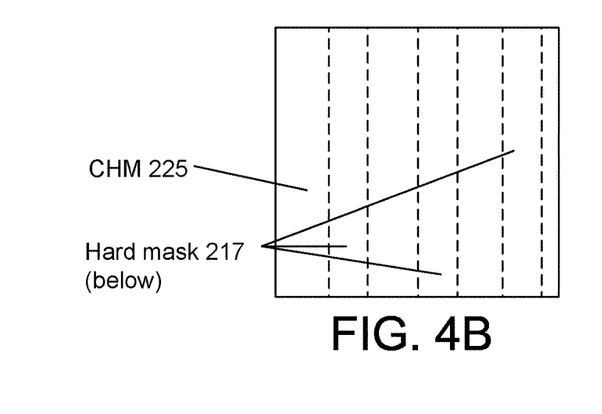
Figure 4C:
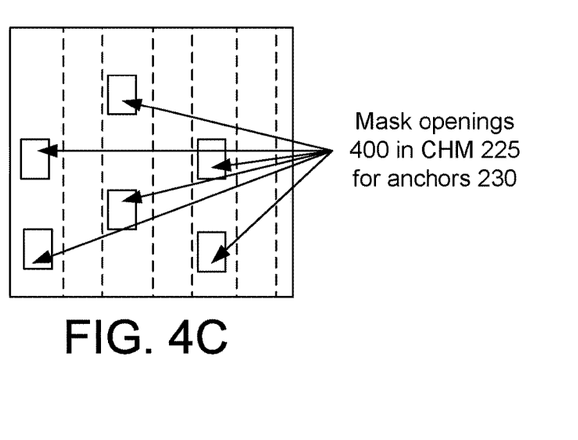

FIGS. 4A-C illustrate anchor locations in a semiconductor structure, according to one implementation. Locations of anchors 230 may correspond with mask openings 400 in the carbon hard mask (CHM) 225.

FIG. 4A illustrates a cross section in the first plane of structure 401A. Structure 401A illustrates a substrate 210. Polysilicon lines 215 may be disposed or grown over substrate 210. The polysilicon lines 215 may be capped with a hard mask 217. A spacer 220 may be deposed on the polysilicon lines 215. Structure 401A further illustrates deposing a carbon hard mask (CHM) 225 on the spacer 220 and creating a mask opening 400 in CHM 225 (e.g., lithographically patterning cuts in the CHM 225) for anchor 230A. FIG. 4A may correspond with FIG. 2B.

FIG. 4B illustrates the CHM 225 disposed on the spacer 220 which is disposed on the hard masks 217, the sides of the polysilicon lines 215, and on the substrate 210. The outline of the hard masks 217 below the CHM 225 are shown by dashed lines. FIG. 4B may be a top view of structure 401A prior to creating the mask openings 400 in CHM 225. FIG. 4B may be a cross section in a second plane perpendicular to the first plane of the CHM 225 of structure 401A prior to creating the mask openings 400.

FIG. 4C illustrates mask openings 400 in CHM 225 for anchors 230. FIG. 4C may be a top view of structure 401A after creating the mask openings 400 in CHM 225. FIG. 4C may be a cross section in a second plane perpendicular to the first plane of the CHM 225 of structure 401A after creating the mask openings 400.

Figure 5:
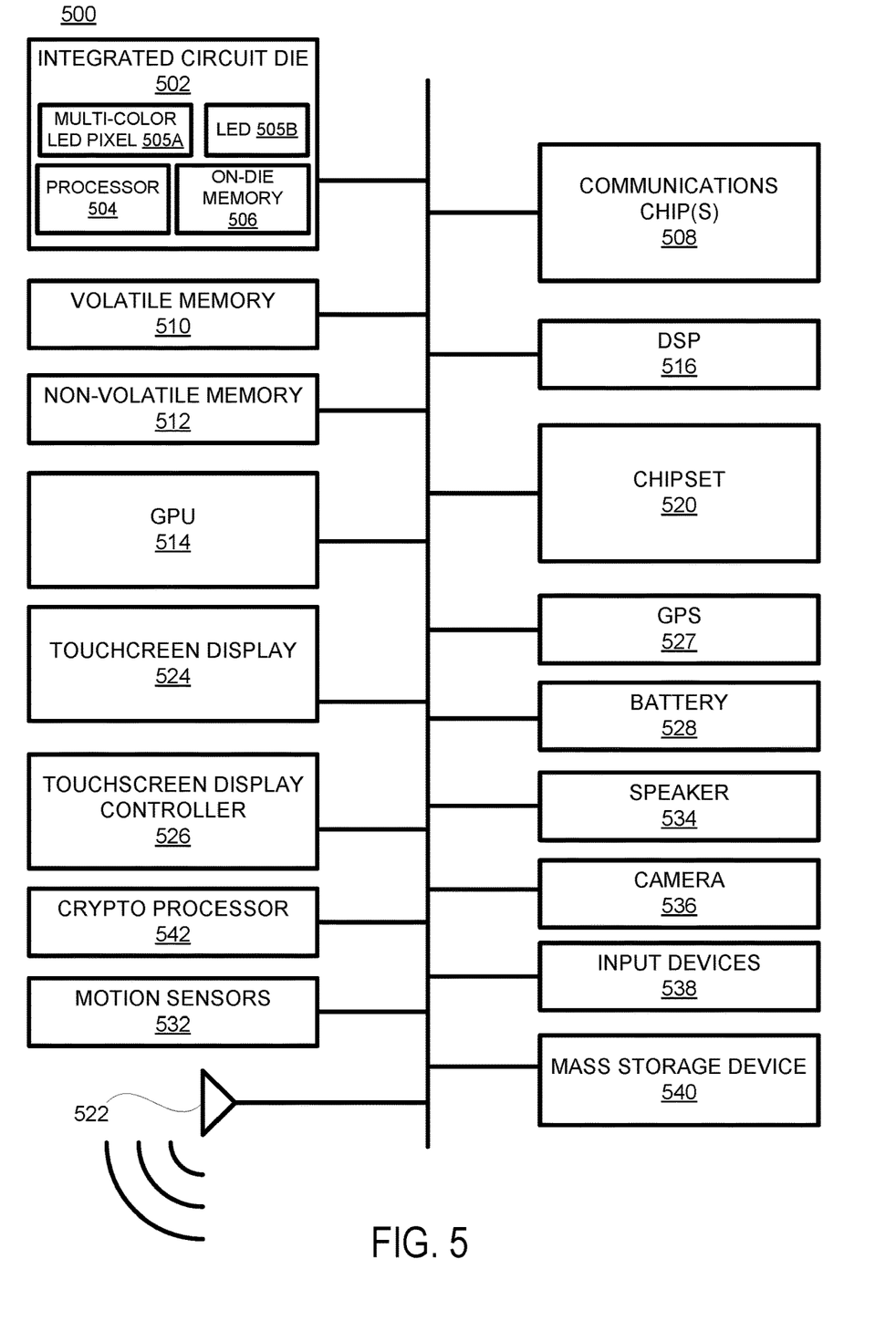
FIG. 5 is a computing device built in accordance with an implementation of the present disclosure.

FIG. 5 is a computing device built in accordance with an implementation of the present disclosure. The computing device 500 may include a number of components. In one implementation, the components are attached to one or more motherboards. In an alternate implementation, some or all of these components are fabricated onto a single system-on-a-chip (SoC) die, such as an SoC used for mobile devices. The components in the computing device 500 include, but are not limited to, an integrated circuit die 502 and at least one communications logic unit 508. In some implementations the communications logic unit 508 is fabricated within the integrated circuit die 502 while in other implementations the communications logic unit 508 is fabricated in a separate integrated circuit chip that may be bonded to a substrate or motherboard that is shared with or electronically coupled to the integrated circuit die 502. The integrated circuit die 502 may include a CPU 504 as well as on-die memory 506, often used as cache memory that can be provided by technologies such as embedded DRAM (eDRAM), SRAM, or spin-transfer torque memory (STT-MRAM). It may be noted that in implementations integrated circuit die 502 may include fewer elements (e.g., without processor 504 and/or on-die memory 506) or additional elements other than processor 504 and on-die memory 506. In one example, integrated circuit die 502 may be an LED, such as a monolithic multi-color LED pixel 505A or non-monolithic LED 505B, with or without processor 504 and/or on-die memory 506. In another example, integrated circuit die 502 may be LED display with multiple monolithic multi-color LED pixels 505A (or multiple LEDs 505B) and a TFT backplane, with or without processor 504 and/or on-die memory 506. In another example, integrated circuit die 502 may include some or all the elements described herein, as well as include additional elements.

Computing device 500 may include other components that may or may not be physically and electrically coupled to the motherboard or fabricated within an SoC die. These other components include, but are not limited to, volatile memory 510 (e.g., DRAM), non-volatile memory 512 (e.g., ROM or flash memory), a graphics processing unit 514 (GPU), a digital signal processor 516, a crypto processor 542 (e.g., a specialized processor that executes cryptographic algorithms within hardware), a chipset 520, at least one antenna 522 (in some implementations two or more antenna may be used), a display or a touchscreen display 524 (e.g., that may include integrated circuit die 502), a touchscreen controller 526, a battery 528 or other power source, a power amplifier (not shown), a voltage regulator (not shown), a global positioning system (GPS) device 527, a compass (not shown), a motion coprocessor or sensors 532 (that may include an accelerometer, a gyroscope, and a compass), a microphone (not shown), a speaker 534, a camera 536, user input devices 538 (such as a keyboard, mouse, stylus, and touchpad), and a mass storage device 540 (such as hard disk drive, compact disk (CD), digital versatile disk (DVD), and so forth). The computing device 500 may incorporate further transmission, telecommunication, or radio functionality not already described herein. In some implementations, the computing device 500 includes a radio that is used to communicate over a distance by modulating and radiating electromagnetic waves in air or space. In further implementations, the computing device 500 includes a transmitter and a receiver (or a transceiver) that is used to communicate over a distance by modulating and radiating electromagnetic waves in air or space.

The communications logic unit 508 enables wireless communications for the transfer of data to and from the computing device 500. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some implementations they might not. The communications logic unit 508 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Infrared (IR), Near Field Communication (NFC), Bluetooth, derivatives thereof, as well as any other wireless protocols that are designated as 3G, 4G, 5G, and beyond. The computing device 500 may include a plurality of communications logic units 508. For instance, a first communications logic unit 508 may be dedicated to shorter range wireless communications such as Wi-Fi, NFC, and Bluetooth and a second communications logic unit 508 may be dedicated to longer range wireless communications such as GPS, EDGE, GPRS, CDMA, WiMAX, LTE, Ev-DO, and others.

The processor 504 (also referred to "processing device" herein) of the computing device 500 includes one or more devices, such as transistors, RF filters, or LEDs, that are formed in accordance with implementations of the present disclosure. The term "processor" or "processing device" may refer to any device or portion of a device that processes electronic data from registers and/or memory to transform that electronic data into other electronic data that may be stored in registers and/or memory. Processor 504 represents one or more general-purpose processing devices such as a microprocessor, a central processing unit, or the like. More particularly, the processor 504 may be complex instruction set computing (CISC) microprocessor, reduced instruction set computing (RISC) microprocessor, very long instruction word (VLIW) microprocessor, or processor implementing other instruction sets, or processors implementing a combination of instruction sets. Processor 504 may also be one or more special-purpose processing devices such as an application specific integrated circuit (ASIC), a field programmable gate array (FPGA), a digital signal processor (DSP), network processor, or the like.

The communications logic unit 508 may also include one or more devices, such as transistors, RF filters, or LEDs, that are formed in accordance with implementations of the present disclosure.

In further implementations, another component housed within the computing device 500 may contain one or more devices, such as transistors, RF filters, or LEDs, that are formed in accordance with implementations of the present disclosure.

In various implementations, the computing device 500 may be a laptop computer, a netbook computer, a notebook computer, an ultrabook computer, a smartphone, a dumbphone, a tablet, a tablet/laptop hybrid, a personal digital assistant (PDA), an ultra-mobile PC, a mobile phone, a desktop computer, a server, a printer, a scanner, a monitor, a set-top box, an entertainment control unit, a digital camera, a portable music player, or a digital video recorder. In further implementations, the computing device 500 may be any other electronic device that processes data.

The above description of illustrated implementations of the disclosure, including what is described in the Abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize.

Various operations are described as multiple discrete operations, in turn, in a manner that is most helpful in understanding the present disclosure, however, the order of description should not be construed to imply that these operations are necessarily order dependent. In particular, these operations need not be performed in the order of presentation.

The terms "over," "above" "under," "between," and "on" as used herein refer to a relative position of one material layer or component with respect to other layers or components. For example, one layer disposed above or over or under another layer may be directly in contact with the other layer or may have one or more intervening layers. Moreover, one layer disposed between two layers may be directly in contact with the two layers or may have one or more intervening layers. In contrast, a first layer "on" a second layer is in direct contact with that second layer. Similarly, unless explicitly stated otherwise, one feature disposed between two features may be in direct contact with the adjacent features or may have one or more intervening layers.

Implementations of the disclosure may be formed or carried out on a substrate, such as a semiconductor substrate. In one implementation, the semiconductor substrate may be a crystalline substrate formed using a bulk silicon or a silicon-on-insulator substructure. In other implementations, the semiconductor substrate may be formed using alternate materials, which may or may not be combined with silicon, that include but are not limited to Germanium, Indium Antimonide, Lead Telluride, Iridium Arsenide, Indium Phosphide, Gallium Arsenide, Indium Gallium Arsenide, Gallium Antimonide, or other combinations of group III-V or group IV materials. Although a few examples of materials from which the substrate may be formed are described here, any material that may serve as a foundation upon which a semiconductor device may be built falls within the spirit and scope of the present disclosure.

A plurality of transistors, such as metal-oxide-semiconductor field-effect transistors (MOSFET or simply MOS transistors), may be fabricated on the substrate. In various implementations of the disclosure, the MOS transistors may be planar transistors, nonplanar transistors, or a combination of both. Nonplanar transistors include FinFET transistors such as double-gate transistors and tri-gate transistors, and wrap-around or all-around gate transistors such as nanoribbon and nanowire transistors. Although the implementations described herein may illustrate only planar transistors, it should be noted that the disclosure may also be carried out using nonplanar transistors.

Each MOS transistor includes a gate stack formed of at least two layers, a gate dielectric layer and a gate electrode layer. The gate dielectric layer may include one layer or a stack of layers. The one or more layers may include silicon oxide, silicon dioxide ($SiO_2$) and/or a high-k dielectric material. The high-k dielectric material may include elements such as Hafnium, Silicon, Oxygen, Titanium, Tantalum, Lanthanum, Aluminum, Zirconium, Barium, Strontium, Yttrium, Lead, Scandium, Niobium, and Zinc. Examples of high-k materials that may be used in the gate dielectric layer include, but are not limited to, Hafnium Oxide, Hafnium Silicon Oxide, Lanthanum Oxide, Lanthanum Aluminum Oxide, Zirconium Oxide, Zirconium Silicon Oxide, Tantalum Oxide, Titanium Oxide, Barium Strontium Titanium Oxide, Barium Titanium Oxide, Strontium Titanium Oxide, Yttrium Oxide, Aluminum Oxide, Lead Scandium Tantalum Oxide, and Lead Zinc Niobate. In some implementations, an annealing process may be carried out on the gate dielectric layer to improve its quality when a high-k material is used.

The gate electrode layer is formed on the gate dielectric layer and may consist of at least one P-type workfunction metal or N-type workfunction metal, depending on whether the transistor is to be a PMOS or an NMOS transistor. In some implementations, the gate electrode layer may consist of a stack of two or more metal layers, where one or more metal layers are workfunction metal layers and at least one metal layer is a fill metal layer. Further metal layers may be included for other purposes, such as a barrier layer.

For a PMOS transistor, metals that may be used for the gate electrode include, but are not limited to, Ruthenium, Palladium, Platinum, Cobalt, Nickel, and conductive metal oxides, e.g., Ruthenium Oxide. A P-type metal layer will enable the formation of a PMOS gate electrode with a workfunction that is between about 4.9 eV and about 5.2 eV. For an NMOS transistor, metals that may be used for the gate electrode include, but are not limited to, Hafnium, Zirconium, Titanium, Tantalum, Aluminum, alloys of these metals, and carbides of these metals such as Hafnium Carbide, Zirconium Carbide, Titanium Carbide, Tantalum Carbide, and Aluminum Carbide. An N-type metal layer will enable the formation of an NMOS gate electrode with a workfunction that is between about 3.9 eV and about 4.2 eV.

In some implementations, when viewed as a cross-section of the transistor along the source-channel-drain direction, the gate electrode may consist of a "U"-shaped structure that includes a bottom portion substantially parallel to the surface of the substrate and two sidewall portions that are substantially perpendicular to the top surface of the substrate. In another implementation, at least one of the metal layers that form the gate electrode may simply be a planar layer that is substantially parallel to the top surface of the substrate and does not include sidewall portions substantially perpendicular to the top surface of the substrate. In further implementations of the disclosure, the gate electrode may consist of a combination of U-shaped structures and planar, non-U-shaped structures. For example, the gate electrode may consist of one or more U-shaped metal layers formed atop one or more planar, non-U-shaped layers.

In some implementations of the disclosure, a pair of sidewall spacers may be formed on opposing sides of the gate stack that bracket the gate stack. The sidewall spacers may be formed from a material such as Silicon Nitride, Silicon Oxide, Silicon Carbide, Silicon Nitride doped with Carbon, and Silicon Oxynitride. Processes for forming sidewall spacers are well known in the art and generally include deposition and etching process operations. In an alternate implementation, a plurality of spacer pairs may be used, for instance, two pairs, three pairs, or four pairs of sidewall spacers may be formed on opposing sides of the gate stack.

In implementations, source and drain regions are formed within the substrate adjacent to the gate stack of each MOS transistor. The source and drain regions may be formed using either an implantation/diffusion process or an etching/deposition process. In the former process, dopants such as Boron, Aluminum, Antimony, Phosphorous, or Arsenic may be ion-implanted into the substrate to form the source and drain regions. An annealing process that activates the dopants and causes them to diffuse further into the substrate typically follows the ion implantation process. In the latter process, the substrate may first be etched to form recesses at the locations of the source and drain regions. An epitaxial deposition process may then be carried out to fill the recesses with material that is used to fabricate the source and drain regions. In some implementations, the source and drain regions may be fabricated using a Silicon alloy such as Silicon Germanium or Silicon Carbide. In some implementations, the epitaxially deposited silicon alloy may be doped in situ with dopants such as Boron, Arsenic, or Phosphorous. In further implementations, the source and drain regions may be formed using one or more alternate semiconductor materials such as germanium or a group III-V material or alloy. In further implementations, one or more layers of metal and/or metal alloys may be used to form the source and drain regions.

In other implementations, one or more interlayer dielectrics (ILD) are deposited over the MOS transistors. The ILD layers may be formed using dielectric materials known for their applicability in integrated circuit structures, such as low-k dielectric materials. Examples of dielectric materials that may be used include, but are not limited to, Silicon Dioxide ($SiO_2$), Carbon doped oxide (CDO), Silicon Nitride, organic polymers such as Perfluorocyclobutane or Polytetrafluoroethylene, Fluorosilicate glass (FSG), and organosilicates such as Silsesquioxane, Siloxane, or Organosilicate glass. The ILD layers may include pores or air gaps to further reduce their dielectric constant.

What is claimed is:

1. An integrated circuit die comprising:
a substrate;
a first anchor and a second anchor on the substrate in a first plane;
a first wire on the first anchor in the first plane;
a third wire on the second anchor in the first plane;
a second wire and a fourth wire above the substrate in the first plane, wherein the second wire is between the first wire and the third wire and the third wire is between the second wire and the fourth wire; and
a dielectric material between upper portions of the first wire, the second wire, the third wire, and the fourth wire to encapsulate an air gap, the air gap laterally surrounding and in contact with the first anchor and the second anchor.

2. The integrated circuit die of claim 1, wherein:
the first wire comprises a metal capped with a first hard mask;
the second wire comprises the metal capped with a second hard mask;
the third wire comprises the metal capped with the first hard mask;
the fourth wire comprises the metal capped with the second hard mask; and
the dielectric material is between each instance of the first hard mask and each instance of the second hard mask.

3. The integrated circuit die of claim 2, wherein:
the first anchor and the second anchor comprise a tungsten oxide, a hafnium oxide, a zirconium oxide, silicon mononitride (SiN), silicon carbide (SiC), silicon carbonitride (SiCN), or a second dielectric comprising disilicon carbide (Si—C—Si);
the metal comprises cobalt (Co), copper (Cu), ruthenium (Ru), cobalt monosilicide (CoSi), or nickel monosilicide (NiSi);
the first hard mask comprises a first material comprising SiC, silicon oxycarbide (SiOC), zirconium dioxide ($ZrO_2$), hafnium dioxide ($HfO_2$), or tungsten oxide; the second hard mask comprises a second material comprising SiC, SiOC, $ZrO_2$, $HfO_2$, or tungsten oxide;
the dielectric material is a third material, the third material comprising a metal oxide; and
the first material, the second material, and the third material are each a different material.

4. The integrated circuit die of claim 1, wherein adjacent wires are not capped with a same hard mask material and the air gap is at least below and on sides of the third wire and the fourth wire.

5. A semiconductor structure comprising:
a first wire and a second wire anchored by one or more anchors to a substrate, the first wire and the second wire in a first plane;
a third wire and a fourth wire above to the substrate in the first plane, wherein the second wire is between the first wire and the third wire and the third wire is between the second wire and the fourth wire; and
a dielectric material between upper portions of the first wire, the second wire, the third wire, and the fourth wire to encapsulate an air gap, the air gap laterally surrounding and in contact with the one or more anchors.

6. The semiconductor structure of claim 5, wherein:
the first wire comprises a metal capped with a first hard mask;
the second wire comprises the metal capped with a second hard mask;
the third wire comprises the metal capped with the first hard mask;
the fourth wire comprises the metal capped with the second hard mask; and the dielectric material is between each instance of the first hard mask and each instance of the second hard mask.

7. The semiconductor structure of claim 6, wherein:

the first wire is anchored to the substrate with a first anchor and the second wire is anchored to the substrate with a second anchor;

the first anchor and the second anchor comprise a tungsten oxide, a hafnium oxide, a zirconium oxide, silicon mononitride (SiN), silicon carbide (SiC), silicon carbonitride (SiCN), or a second dielectric comprising disilicon carbide (Si—C—Si);

the metal comprises cobalt (Co), copper (Cu), ruthenium (Ru), cobalt monosilicide (CoSi) or nickel mono-silicide (NiSi);

the first hard mask comprises a first material comprising SiC, silicon oxycarbide (SiOC), zirconium dioxide (ZrO$_2$), hafnium dioxide (HfO$_2$), or tungsten oxide;

the second hard mask comprises a second material comprising SiC, SiOC, ZrO$_2$, HfO$_2$, or tungsten oxide;

the dielectric material is a third material, the third material comprising a metal oxide; and the first material, the second material, and the third material are each a different material.

8. The semiconductor structure of claim 5, wherein adjacent wires are not capped with a same hard mask material and the air gap is at least below and on sides of the third wire and the fourth wire.

9. An integrated circuit die comprising:

a substrate;

a first anchor and a second anchor on the substrate in a first plane, wherein the first anchor and the second anchor comprise a tungsten oxide, a hafnium oxide, a zirconium oxide, silicon mononitride (SiN), silicon carbide (SiC), silicon carbonitride (SiCN), or a second dielectric comprising disilicon carbide (Si—C—Si);

a first wire on the first anchor in the first plane, wherein the first wire comprises a metal capped with a first hard mask, wherein the metal is selected from the group consisting of cobalt (Co), copper (Cu), ruthenium (Ru), cobalt monosilicide (CoSi), and nickel mono-silicide (NiSi), wherein the first hard mask comprises a first material selected from the group consisting SiC, silicon oxycarbide (SiOC), zirconium dioxide (ZrO$_2$), hafnium dioxide (HfO$_2$), and tungsten oxide, and wherein the second hard mask comprises a second material selected from the group consisting of SiC, SiOC, ZrO$_2$, HfO$_2$, and tungsten oxide;

a third wire on the second anchor in the first plane, wherein the third wire comprises the metal capped with the first hard mask;

a second wire and a fourth wire above the substrate in the first plane, wherein the second wire is between the first wire and the third wire and the third wire is between the second wire and the fourth wire, wherein the second wire comprises the metal capped with a second hard mask, wherein the fourth wire comprises the metal capped with the second hard mask; and a dielectric material between upper portions of the first wire, the second wire, the third wire, and the fourth wire to encapsulate an air gap, wherein the dielectric material is between each instance of the first hard mask and each instance of the second hard mask, wherein the dielectric material is a third material, the third material comprising a metal oxide, and wherein the first material, the second material, and the third material are each a different material.

\* \* \* \* \*